United States Patent [19]
Ito et al.

[11] Patent Number: 5,152,857
[45] Date of Patent: Oct. 6, 1992

[54] METHOD FOR PREPARING A SUBSTRATE FOR SEMICONDUCTOR DEVICES

[75] Inventors: Tatsuo Ito, Joetsu; Atsuo Uchiyama, Chiisagata; Masao Fukami, Nagano, all of Japan

[73] Assignee: Shin-Etsu Handotai Co., Ltd., Tokyo, Japan

[21] Appl. No.: 672,979

[22] Filed: Mar. 21, 1991

[30] Foreign Application Priority Data

Mar. 29, 1990 [JP] Japan .................................. 2-81696

[51] Int. Cl.$^5$ .............................................. B24B 1/00
[52] U.S. Cl. .................... 156/153; 156/281; 156/257; 148/DIG. 12; 148/DIG. 135; 437/974
[58] Field of Search ................ 156/87, 153, 154, 281, 156/257, 308.2; 51/216 LP, 283 R, 283 E; 148/DIG. 12, DIG. 135; 437/62, 974

[56] References Cited

U.S. PATENT DOCUMENTS

| | | | |
|---|---|---|---|
| 4,638,552 | 1/1987 | Shimbo et al. | 156/154 X |
| 4,671,846 | 6/1987 | Shimbo et al. | 156/153 X |
| 4,810,318 | 3/1989 | Haisma et al. | 156/281 X |
| 4,854,986 | 8/1989 | Raby | 156/87 |
| 4,878,957 | 11/1989 | Yamaguchi et al. | 437/62 X |
| 4,883,215 | 11/1989 | Goesele et al. | 156/281 X |
| 4,939,101 | 7/1990 | Black et al. | 437/62 |
| 4,983,251 | 1/1991 | Haisma et al. | 437/62 X |
| 5,032,544 | 7/1991 | Ito et al. | 148/DIG. 12 X |
| 5,071,785 | 12/1991 | Nakazato et al. | 437/62 |

FOREIGN PATENT DOCUMENTS

| | | | |
|---|---|---|---|
| 48-40372 | 6/1973 | Japan . | |
| 52-45792 | 4/1977 | Japan | 51/283 R |
| 55-106762 | 8/1980 | Japan | 51/283 E |
| 62-27040 | 6/1987 | Japan . | |
| 2-303759 | 12/1990 | Japan | 51/283 E |

OTHER PUBLICATIONS

"Nikkei Microdevices", Nikkei-McGraw-Hill, Mar. 1, 1988, pp. 92-98.

Primary Examiner—Jeff H. Aftergut

[57] ABSTRACT

In a method for preparing a substrate for semiconductor device, the substrate is prepared either by directly bonding a bonding wafer to a base wafer or by bonding the bonding wafer to the base wafer with an oxide film formed on at least the bonding surface of the bonding wafer or the bonding surface of the base wafer to make finished semiconductor devices with an SOI structure. Prior to the bonding operation, the bonding wafer and the base wafer are subjected to the steps of (1) making the diameter of the bonding wafer smaller than the diameter of the base wafer, (2) setting the beveling width of the back side (bonding side) of the bonding wafer at 50 microns or less, and (3) beveling the front side of said base wafer so that the bonding surface of the base wafer is equal in size to the bonding surface of the bonding wafer. When the bonding wafer, which has been bonded to the base wafer, is subjected to polishing into a thin film, the peripheral portions of the bonding wafer form a smooth surface of the base wafer. This prevents the peripheral portions from chipping off.

3 Claims, 4 Drawing Sheets

METHOD FOR PREPARING A SUBSTRATE FOR SEMICONDUCTOR DEVICES

DETAILED DESCRIPTION OF THE INVENTION

1. Field Of The Invention

This invention relates to a technology for manufacturing a substrate for semiconductor devices which is formed by bonding wafers together, and more particularly to a technology for beveling wafers to be used for said substrate for semiconductor devices.

2. Background Of The Invention

An SOI structure has hitherto been proposed for a substrate for semiconductor devices in order to facilitate dielectric isolation of integrated circuits in which tiny semiconductor devices are highly densely incorporated to eliminate a latch-up phenomenon in the integrated circuits, especially, CMOS (Complementary Metal-Oxide Semiconductors) integrated circuits.

To provide such an SOI structure, a method has been adopted in which an oxide film (insulating layer) is formed on a silicon substrate, further a polycrystalline layer is precipitated on the oxide film, and then further a single crystalline thin film is formed through transformation of the polycrystalline layer by a laser beam irradiated the reonto. Otherwise, a method has been adopted in which a silicon monocrystalline thin film is formed on a sapphire substrate from vapor phase by way of thermal decomposition reaction.

However, the crystallinity of the silicon thin film on the insulating layer or the sapphire substrate formed by these methods has not been satisfactory. Consequently, further technical improvements are being successfully made in which silicon wafers are bonded to each other with an insulating layer placed therebetween, and one of the resulting bonded silicon wafers is polished or etched to be formed into a desired thin layer which is used as an active region for built-in semiconductor devices of an integrated circuit.

At the same time, however, a so-called epitaxial wafer which comprises two high and low resistivity layers thereon has been employed as a substrate for preparing bipolar semiconductor devices.

When such an epitaxial wafer is prepared from a silicon semiconductor material, the vapor phase epitaxial growth process is generally employed. For instance, thermal decomposition or hydrogen-reduction of trichlorosilane or tetrachlorosilane causes to grow a p-type or n-type high-resistivity single-crystal thin film several microns thick on a low-resistivity silicon single-crystal mirror wafer for the purpose of preparing the substrate. This vapor phase epitaxial growth process has a following disadvantage. Thermal diffusion of impurities from the underlying single-crystal wafer or autodoping via the vapor phase makes the impurity level at the growth interface comparatively high, and under some circumstances the impurity level undesirably gets high up to 5 micron from the growth interface in the layer. In this case it is impossible to vary the resistivity in a step-like manner at the growth interface. In recent years, it has been proposed, as in the Japanese Patent Laid-Open Publication No. 62-27040, that two semiconductor mirror wafers having a low and high resistivity, respectively, are heated in a state of directly joining each other to be bonded for the purpose of obtaining a substrate for preparing bipolar semiconductor devices provided with a structure of a step-like variance in resistivity.

A bonding process of wafers having an SOI structure will be described in detail to clarify the problems in the prior art related to the present invention.

For such a bonding method there is proposed a process of employing a deadweight for applying a pressure on the wafers and also a process of applying an electrostatic force in order to bond two wafers. The former prior art is described, for instance, in Japanese Patent Laid-Open Publication No. 48-40372. This known document teaches a method wherein silicon wafers are superposed on each other with an oxide film placed therebetween for the purpose of bonding the wafers at 1,100 degrees centigrade and higher and at pressures 100 kg/square centimeter and more. The latter prior art is described in pages 92 through 98 of "Nikkei Microdevices" issued by Nikkei-Mcgraw-Hill, Inc. on Mar. 1, 1988. Hereinafter such a substrate for semiconductor devices will be described.

In FIG. 3 (C), an example of the substrate in SOI structure for semiconductor devices is shown.

Wafers 1a and 1b are bonded to each other with oxide films 1c interposed therebetween. Subsequently, the side exposed to the air of the wafer 1b is polished and/or etched to be a thin film so that this substrate is achieved. The preparing process will be more particularly described as follows:

At first, prior to bonding wafers 1a and 1b to each other, as shown in FIG. 3 (A), the bonding wafer 1b is thermally oxidized over the entire surface thereof to form an oxide film about 0.8 micron in thickness. In this case, the bonding surface of the wafer 1a can also be thermally oxidized so that the total thickness of the oxide films will be 0.8 micron in the state of bonding. Then, wafers 1a and 1b are superposed on each other (FIG. 3 (B)), then are put into a furnace in the state of superposition and further an electrical voltage of approximately 300 volts is applied in a pulse mode across the superposed wafers in an atmosphere of nitrogen at a temperature of about 500 degrees centigrade. In this way, wafers 1a and 1b are bonded to each other. The bonded wafers thus treated have a strong bonding strength therebetween so that the wafers can be put in the conventional IC manufacturing process as they stand.

Wafer 1b of the bonded wafers thus obtained is polished and/or etched etc. from outside as it stands to be made into a thin film. Thus, a substrate with an SOI structure for forming semiconductor devices is prepared as shown in FIG. 3 (C).

Conventionally, base wafer 1a and bonding wafer 1b, which are bonded together to prepare a substrate for semiconductor devices by such a bonding method as above, had substantially the same diameter, respectively. Further, the beveled portions at the periphery of the front and back side of each wafer were substantially symmetrical in shape.

That is to say, as shown in FIG. 4, the base wafer 1a is composed as follows: When the beveled width of the beveled portion 11a at the front side of the base wafer 1a is $w_1$ and the beveled depth thereof is $d_1$, and the beveled width of the beveled portion 11b at the back side of the base wafer 1a is $w_2$ and the beveled depth thereof is $d_2$, then $w_1 = w_2$ and $d_1 = d_2$. The angle made between the front side of the base wafer 1a and the slope of the beveled portion 11a, that is, angle $\theta_1 = \arctan(d_1/w_1)$ is identical with the angle made between the back side of the base wafer 1a and the slope of the beveled portion 11b, that is, angle $\theta_2 = \arctan (d_2/w_2)$.

On the other hand, if a beveled width of a beveled portion 12a at the front side of the bonding wafer 1b is $w_3$ and the beveled depth thereof is $d_3$, and a beveled width of the beveled portion 12b on the back side of the bonding wafer 1b is $w_4$, and a beveled depth thereof is $d_4$, then $w_3 = w_4$, $d_3 = d_4$. Then, the bonding wafer 1b is so constructed that the angel $\theta_3 = \arctan (d_3/w_3)$ made by a slope of the beveled portion 12a and the front side of the bonding wafer 1b, and the angle $\theta_4 = \arctan (d_4/w_4)$ made by a slope of the beveled portion 12b and the back side of the bonding wafer 1b are identical with each other.

However, the above technology has a following problem: The beveled width $w_1$ of the beveled portion 11a at the front side of the base wafer 1a is set at values of width greater than a predetermined value, as stated above, and at the same time, beveling angle $\theta_1$ at the front side of the base wafer 1a is set at values of angle smaller than a predetermined value, in order to prevent the occurrence of crowning at the peripheral portion of the wafer at the time of performing subsequent processes such as photoresist coating and formation of epitaxial layers. Therefore conventionally, under such circumstances, the values are $w_1 = w_2 = w_3 = w_4$ and $d_1 = d_2 = d_3 = d_4$, respectively at the time of beginning a thinning operation immediately after a bonding operation. The front and back side of the wafers 1a and 1b are subjected to beveling into a symmetrical form. Subsequently, when the front side of the bonding wafer 1b is subjected to polishing into a thin layer after bonding, the beveled portion on the back side of the wafer 1b is not supported by the front side of the base wafer 1a. As a result, the outer peripheral portions are partially chipped off, depending upon the degree of a thinning operation, which causes fine irregularities at the outer peripheral portions of the bonding wafer 1b. This, in turn, causes a contamination by dust particles resulting from the chipping off of the peripheral portions during the subsequent manufacturing processes of semiconductor devices.

SUMMARY OF THE INVENTION

The present invention has been made in the light of the above problem.

The object of the present invention is to provide a beveling technology which prevents contamination and other disadvantages caused by dust particles resulting from the chipping off.

The present invention will be described in detail as follows:

In order to achieve the above object according to the present invention, when the base wafer and bonding wafer are bonded directly together, or either of them is thermally heated and then bonded together, to prepare a substrate for semiconductor devices, the diameter of the bonding wafer is made smaller than the diameter of the base wafer, the beveled width of the back side (bonding side) of the bonding wafer is set at 50 micron or less, and further the size of the bonding surface of the base wafer and the size of the bonding surface of the bonding wafer are made equal to each other immediately before bonding, as shown in FIG. 1(B).

According to the present invention the subsequent thinning operation of the bonding wafer by means of a soft polishing cloth permits the peripheral edges of the bonding wafer to be easily subjected to excessive polishing. As a result, because the beveled width of the back side (bonding side) of the bonding wafer is sufficiently small, the excessively polished peripheral edges are shaped into a continuous curve extending from the beveled edge portion of the front side of the base wafer 21a to be integral with the polished surface of the bonding wafer, as shown in FIG. 1(C). Further, as shown in FIG. 1 (B), both the small size of the beveled width of the back side of the bonding wafer and the smaller diameter of the bonding wafer than the base wafer prevent the thinned bonding wafer from being shaped like the bonding wafer having a protruding peripheral edges as in the case shown in FIG. 3 (C). This also prevents the peripheral edge of the thinned bonding wafer from being easily chipped off, different from the case of the prior art. The bonded wafers which have one of the wafers thinned according to the present invention have a cross section similar to the cross section of a polished surface of a single mirror wafer. (See FIG. 1 (C)) Therefore, the present invention can achieve the direct bonding of high- and low-resistivity wafers, with a step-like variance in resistivity at the bonding interface, having an ideal smooth beveled surface around the periphery like conventional epitaxial wafers. This is also true for the case of the wafers with an SOI structure. The wafers with an SOI structure also has an appearance similar to the directly bonded wafers. In any case, no crowning phenomenon due to photoresist coating occurs in the photo-lithography process.

DESCRIPTION OF THE PREFERRED EMBODIMENTS

A description will be made on the preferred embodiments of the manufacturing processes of a substrate for semiconductor devices with reference to the drawings according to the present invention.

Figure 1A:
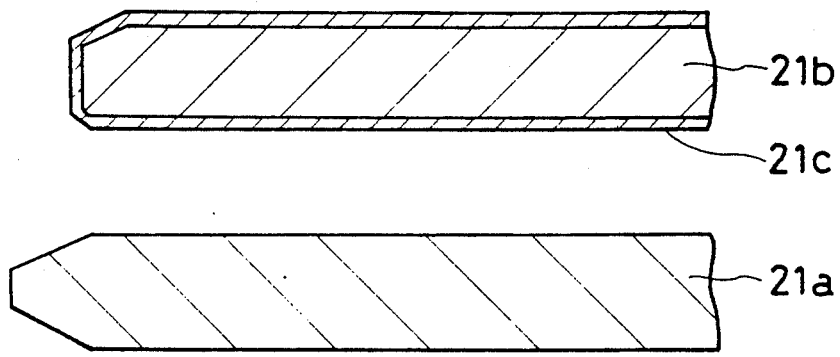
FIGS. 1(A) to 1(C) are drawings showing the manufacturing processes related to the method for preparing a substrate for semiconductor devices with an SOI structure, which processes are described in the embodiments according to the present invention.
Figure 1B:
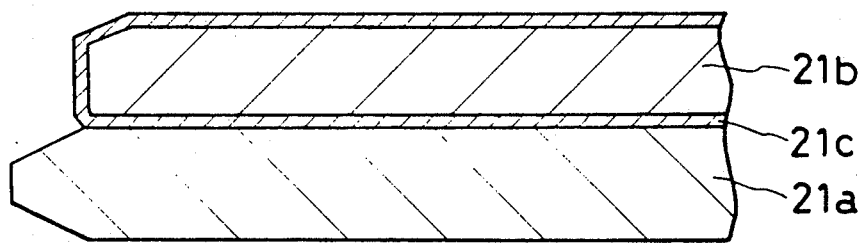
Figure 1C:
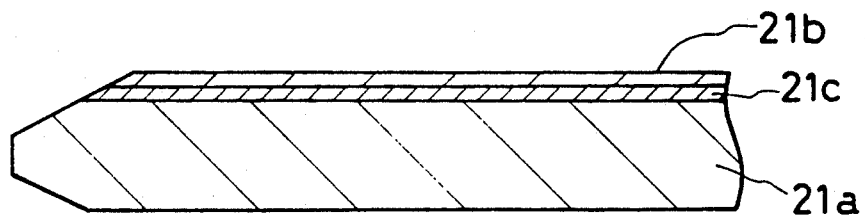

FIGS. 1(A) to 1(C) are longitudinal cross-sectional drawings showing the manufacturing processes of the substrate with an SOI structure according to the present invention.

At first base wafer 21a and bonding wafer 21b, which has a smaller diameter than 21a, are bonded together with an oxide film 21c interposed therebetween and then bonding wafer 21b is, for instance, polished and/or etched into a thin film to manufacture a substrate.

Base wafer 21a and bonding wafer 21b have been subjected to beveling beforehand.

Figure 2:
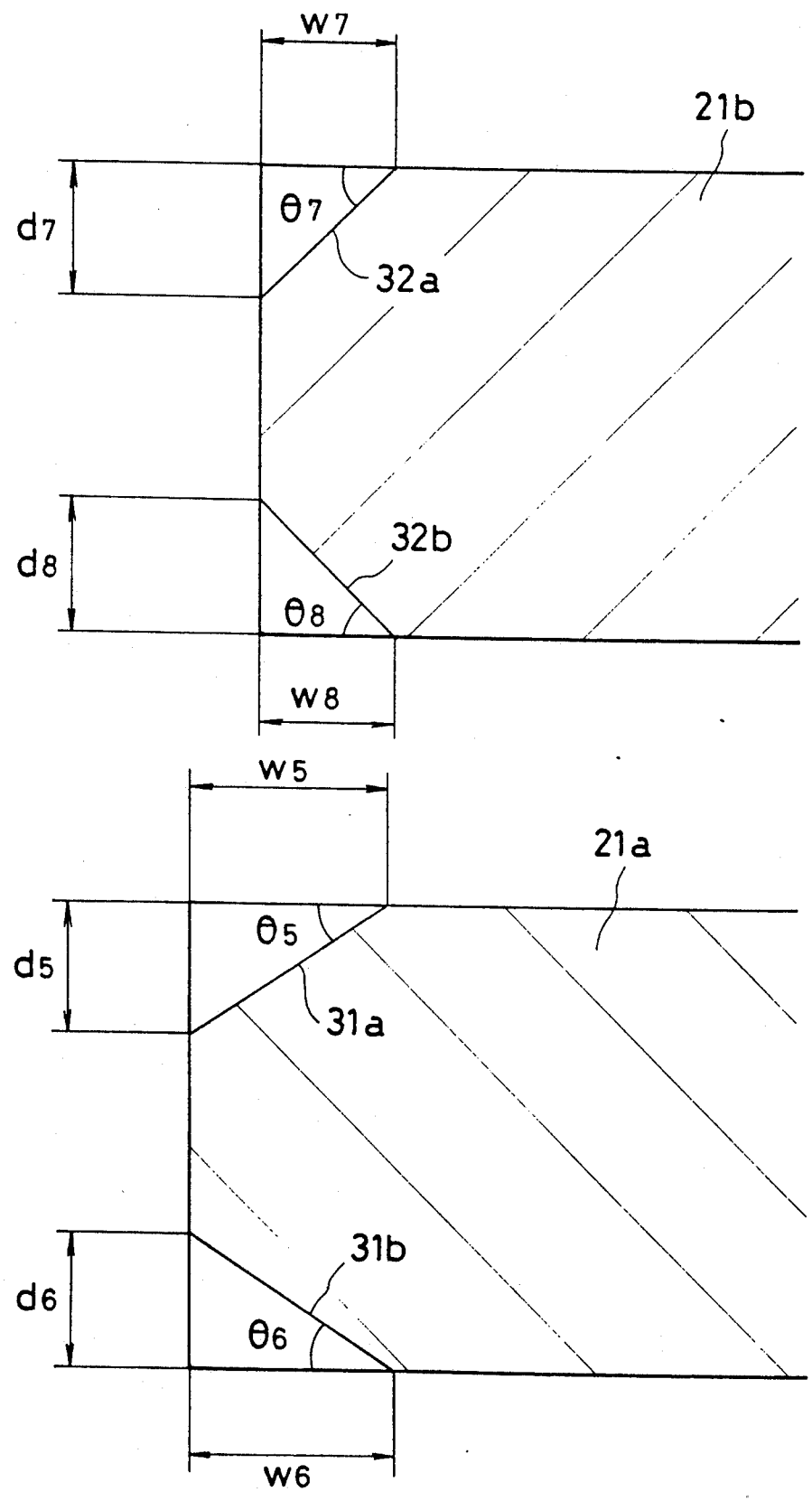
FIG. 2 is a longitudinal cross-sectional drawing in part of a wafer showing the beveling conditions.
Figure 3A:
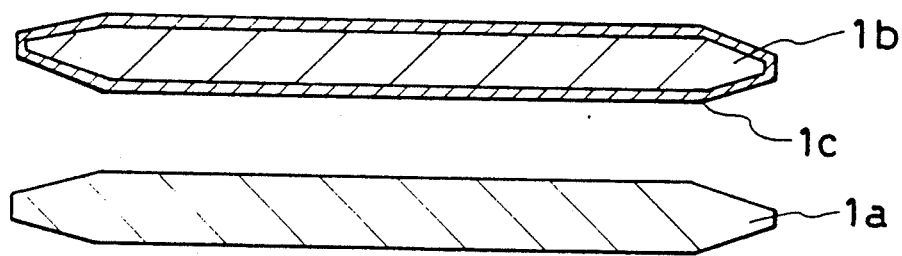
FIGS. 3(A) to 3(C) are drawings showing conventional manufacturing processes.
Figure 3B:
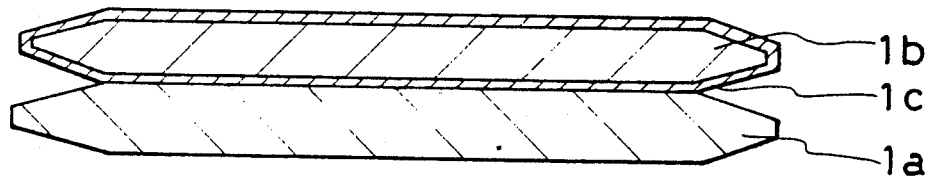
Figure 3C:
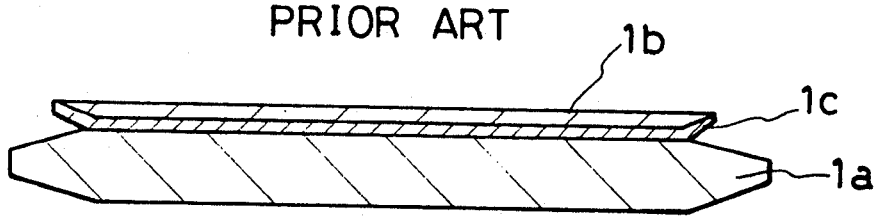
Figure 4:
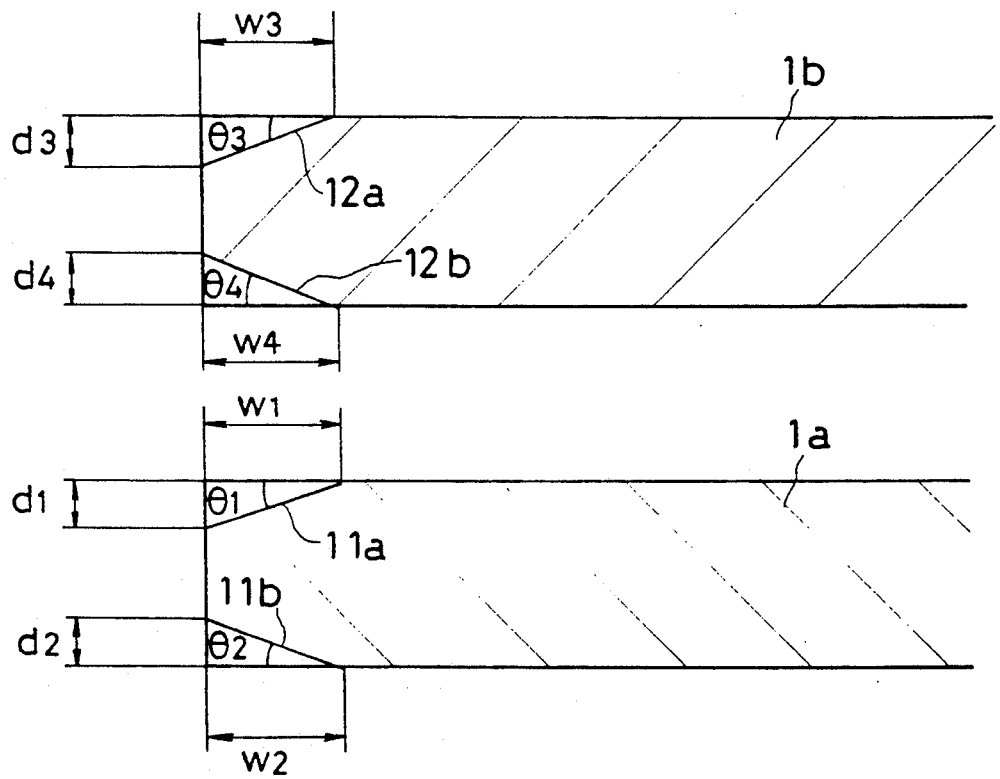
FIG. 4 is a longitudinal cross-sectional drawing in part of a wafer showing the beveling conditions of a substrate for semiconductor devices in FIGS. 3(A) to 3(C).

Therefore, as shown in FIG. 2, base wafer 21a has a beveled width $w_5$ and a beveled depth $d_5$ relative to the beveled portion 31a at the front side thereof. The base wafer 21a also has a beveled width $w_6$ and a beveled depth $d_6$ relative to the beveled portion 31b at the back side thereof. In this case $w_5 = w_6$, $d_5 = d_6$. Angle $\theta_5 = \arctan$ tan ($d_5/w_5$), the angle between the front side and the slope of the beveled portion 31a and angle $\theta_6$ = arc tan ($d_6/w_6$), the angle between the back side and the slope of the beveled portion 31b are equal. It is to be noted that the beveled width $d_5$ of the front side and the beveled angle $\downarrow_5$ = arc tan ($d_5/w_5$) of base wafer 21a are subjected to change in the course of a thinning operation of bonding wafer 21b (to 5 micron or less), as shown in FIGS. 1(B) and 1(C) so that the width and the angle have a value, respectively, in which a crowning phenomenon can be prevented at subsequent processes of a photoresist application and also, if required, of an epitaxial layer formation. On the other hand, beveled width $w_6$ of the back side and beveled angle $\theta_6$ = arc tan ($d_6/w_6$) of base wafer 21a have nothing to do with the crowning phenomenon at the time of the photoresist application and the epitaxial layer formation. The values of the width and the angle are so selected that the values fall within the range in which no chipping off can occur at the time of handling base wafer 21a.

On the other hand, if the beveled width relative to the beveled portion 32a on the front side of the bonding wafer 21b is $w_7$ and the beveled depth thereof is $d_7$, and the beveled width relative to the beveled portion 32b on the back side thereof is $w_8$, and the beveled depth thereof is $d_8$, then $w_8$ can be 50 micron or less and $w_7$ can be, for instance, the same as $w_6$. The value of $d_8$ can be, for instance, the same as $d_7$ (= $d_5$). Angle $\theta_8$ = arc tan ($d_8/w_8$) between the slope of the beveled portion 32b and the back side can be so selected that no chipping off can occur in the course of the polishing operation. The angle can be a minimum of 30 degrees to carry out the present invention. The reason is as follows: When the bonding wafer is polished into a thin film of 5 micron thick or less, the periphery of the bonding wafer is excessively polished to wear out with the result that the periphery of the bonding wafer which has been thinned out forms an extension of the beveled slope of the base wafer as shown in FIG. 1(C). In contrast, angle $\theta_7$ = arc tan ($d_7/w_7$) can be an ordinary angle which can take the same value of $\theta_6$.

The value of diameter $D_1$ of the base wafer 21a and the value of diameter $D_2$ of the bonding wafer 21b are determined so as to establish a relation ($D_1 - w_5$) = ($D_2 - w_8$).

The beveled width $w_5$ shown above on the front side of the base wafer 21a (FIG. 2) appears increased more than the original width as shown in FIG. 1(C). But this results from the following fact: The bonding wafer 21b has an oxide film formed on the bonding surface thereof and then is bonded to the base wafer 21a. The bonding wafer 21b is polished into a thin film, The thinned bonding wafer 21b and the film bonded to the base wafer 21a appear as if they were an extended part of the beveled width $w_5$ of the base wafer 21a. The thickness of the oxide film is only 1 micron. The increased width resulting from the addition of the oxide film is so little that it can be negligible.

The typical effects of the present invention are described as follows:

According to the present invention, at the time of bonding a base wafer and a bonding wafer with an oxide film interposed therebetween or directly without any oxide film interposed, for the manufacture of a substrate for forming semiconductor devices, the diameter of the bonding wafer is made smaller than the diameter of the base wafer. Further, the beveled width of the back side, that is, the bonding side of the bonding wafer is made sufficiently small. Still further, both of the base wafer and the bonding wafer are subjected to beveling prior to bonding, whereby the size of the bonding surface of the bonding wafer and the size of the bonding surface of the base wafer become the same. As a result, in case the bonding wafer bonded to the base wafer is subjected to polishing into a thin film, both of the bonded wafers can form a continuous smooth beveled slope, as shown in FIG. 1(C). No chipping off can be expected. Further, no crowning phenomenon occurs at the time of photoresist application or, if required, epitaxial film formation.

What is claimed is:

1. A method for preparing a substrate for semiconductor devices, comprising:

providing a circular bonding wafer and a circular base wafer, with the diameter of the bonding wafer being smaller than the diameter of the base wafer;

beveling the peripheral edge of a first side of said bonding wafer to have a beveled width of 50 micron or less, wherein the beveled width is the width of the bevel at the respective side of the wafer, the beveled edge of said bonding wafer surrounding a bonding surface on said first side thereof;

beveling the peripheral edge of a first side of said base wafer to surround a bonding surface that is equal in size to the bonding surface of said bonding wafer prior to bonding said bonding wafer to said base wafer, and directly bonding said bonding surface of said bonding wafer to said bonding surface of said base wafer.

2. A method for preparing a substrate for semiconductor devices, comprising:

providing a circular bonding wafer and a circular base wafer with the diameter of the bonding wafer being smaller than the diameter of the base wafer;

beveling the peripheral edge of a first side of said bonding wafer to have a beveled width of 50 micron or less, wherein the beveled width is the width of the bevel at the respective side of the wafer, the beveled edge of said bonding wafer surrounding a bonding surface on said first said thereof;

beveling the peripheral edge of a first said of said base wafer to have a bonding surface that is equal in size to the bonding surface of said bonding wafer prior to bonding said bonding wafer to said base wafer;

forming an oxide layer on at least one of said bonding surfaces; and bonding said bonding surface of said bonding wafer to said bonding surface of said base wafer with said oxide layer therebetween to make a semiconductor device with an SOI structure.

3. A method for preparing a substrate for semiconductor devices, comprising:

beveling a peripheral edge of a first side of a bonding wafer to have a beveled width of 50 microns or less, the beveled edge of said first side of said bonding wafer surrounding a bonding surface;

beveling a peripheral edge of a first side of a base wafer having transverse dimensions greater than the respective transverse dimensions of said bonding wafer with the beveled edge of said first side of said base wafer surrounding a bonding surface that is equal in size to the bonding surface of said bonding wafer;

the beveled widths of said wafers being the widths of the bevels at the edges of the respective sides of said bonding and base wafers;

providing an oxide layer on at least one of said bonding surfaces; and bonding said bonding surfaces of said bonding and base wafers together with said oxide layer therebetween, to form a semiconductor device with an SOI structure.

* * * * *